(12) United States Patent
Chang

(10) Patent No.: US 9,817,030 B2
(45) Date of Patent: Nov. 14, 2017

(54) TESTING DEVICE FOR TESTING AN UNDER-TEST OBJECT

(71) Applicant: Primax Electronics Ltd., Taipei (TW)

(72) Inventor: Pei-Ming Chang, Taipei (TW)

(73) Assignee: Primax Electronics Ltd., Taipei (TW)

( * ) Notice: Subject to any disclaimer, the term of this patent is extended or adjusted under 35 U.S.C. 154(b) by 291 days.

(21) Appl. No.: 14/641,629

(22) Filed: Mar. 9, 2015

(65) Prior Publication Data

US 2016/0131681 A1    May 12, 2016

(30) Foreign Application Priority Data

Nov. 7, 2014  (TW) .............................. 103138726 A

(51) Int. Cl.
| | |
|---|---|
| G01R 31/20 | (2006.01) |
| G01R 1/18 | (2006.01) |
| G01R 31/28 | (2006.01) |
| G01R 1/067 | (2006.01) |

(52) U.S. Cl.
CPC ........... *G01R 1/18* (2013.01); *G01R 31/2808* (2013.01); *G01R 1/06722* (2013.01)

(58) Field of Classification Search
CPC ............ G01R 31/2601; G01R 31/2891; G01R 31/2834; G01R 31/2887; G01R 31/002
See application file for complete search history.

(56) References Cited

U.S. PATENT DOCUMENTS

| | | | | |
|---|---|---|---|---|
| 3,975,680 A | * | 8/1976 | Webb .................... | G01R 1/067 324/537 |
| 4,597,622 A | * | 7/1986 | Coe ..................... | H01R 4/2491 439/421 |
| 4,931,726 A | * | 6/1990 | Kasukabe .......... | G01R 1/07314 324/755.05 |
| 5,204,615 A | * | 4/1993 | Richards ............ | G01R 31/2805 324/755.05 |
| 5,489,820 A | * | 2/1996 | Ivanov ................. | H05H 1/0025 315/111.21 |
| 6,323,667 B1 | * | 11/2001 | Kazama ............. | G01R 1/06722 324/755.05 |
| 8,179,143 B2 | * | 5/2012 | Yeh .................... | G01R 31/2806 324/522 |
| 9,182,425 B2 | * | 11/2015 | Meng ................. | G01R 1/06705 |
| 2005/0168231 A1 | * | 8/2005 | Kim .................... | G01R 31/2887 324/754.03 |

(Continued)

*Primary Examiner* — Tung X Nguyen
*Assistant Examiner* — Dominic Hawkins
(74) *Attorney, Agent, or Firm* — Lynette Wylie; Apex Juris, pllc

(57) ABSTRACT

A testing device includes a base body, a holder, an electrically conductive plate, plural testing probes and plural insulation structures. The testing device of the present invention uses the electrically conductive plate to replace the plastic plate of the conventional testing device. Consequently, the electrostatic discharge effect is avoided. Moreover, the insulation structure is arranged between the testing probe and the electrically conductive plate to separate the testing probe from the electrically conductive plate so as to avoid the electric leakage problem. Consequently, the testing device of the present invention is capable of avoiding the electrostatic discharge effect without causing damage of the under-test object and reducing the measurement accuracy.

9 Claims, 4 Drawing Sheets

(56) References Cited

U.S. PATENT DOCUMENTS

| | | | |
|---|---|---|---|
| 2007/0156130 A1* | 7/2007 | Thistle | A61B 18/1477 606/41 |
| 2009/0007688 A1* | 1/2009 | Foote | G01M 5/0033 73/786 |
| 2011/0006799 A1* | 1/2011 | Mochizuki | G01R 3/00 324/756.07 |
| 2011/0036618 A1* | 2/2011 | Lee | H05K 1/0271 174/250 |
| 2011/0121850 A1* | 5/2011 | Lee | G01R 1/06722 324/756.02 |
| 2011/0282593 A1* | 11/2011 | Nickel | G01R 31/04 702/39 |
| 2012/0327543 A1* | 12/2012 | Ellinger | C01B 33/035 361/87 |
| 2013/0207683 A1* | 8/2013 | Tanaka | G01R 1/07378 324/756.03 |
| 2014/0197859 A1* | 7/2014 | Fan | G01R 1/07357 324/755.01 |
| 2015/0015289 A1* | 1/2015 | Eldridge | G01R 1/06733 324/754.03 |
| 2015/0168450 A1* | 6/2015 | Wooden | G01R 1/07371 324/756.02 |
| 2016/0274147 A1* | 9/2016 | Hsu | G01R 1/067 |

* cited by examiner

TESTING DEVICE FOR TESTING AN UNDER-TEST OBJECT

FIELD OF THE INVENTION

The present invention relates to a testing device, and more particularly to a testing device for testing an under-test object.

BACKGROUND OF THE INVENTION

With increasing development of science and technology, electronic devices become more and more popular to personal users. The widely-used electronic devices include for example desktop computers, notebook computers, smart phones, tablet computers or the like. Each of these electronic devices has at least one circuit board. Moreover, at least one electronic component is fixed on the circuit board for executing a specified function. Moreover, through the cooperation of plural electronic components on the circuit board, the electronic device can be driven and operated. Generally, plural electrical contacts are formed on the circuit board so as to be electrically connected with these electronic components.

Generally, in the fabrication of the electronic device, a testing method should be performed to realize whether the functions of the electronic device are normal or not. The testing method which comprises a procedure of testing the circuit board before the electronic device is assembled and a procedure of testing the overall functions of the assembled electronic device after the electronic device is fabricated. By testing the circuit board, the manufacturer may realize whether any defects are present in the circuit board before the electronic device is assembled. If the procedure of testing the circuit board is not done and some defects are found after the electronic device is assembled, the manufacturer has to disassemble the electronic device to debug the circuit board. It is time-consuming to disassemble the electronic device to debug the circuit board.

Hereinafter, the structure of a testing device for testing a circuit board will be illustrated with reference to FIG. 1. FIG. 1 schematically illustrates the structure of a conventional testing device. As shown in FIG. 1, the conventional testing device 1 comprises a base body 11, a holder 12, a plastic plate 13 and plural testing probes 14. The holder 12 is disposed on the base body 11 for supporting an under-test circuit board 10. The plastic plate 13 is disposed on the base body 11, and located over the holder 12. The plural testing probes 14 are disposed on the plastic plate 13. Moreover, in response to the user's operation, the plastic plate 13 is movable relative to the base body 11 so as to be close to or far away from the holder 12. Moreover, the plural testing probes 14 are penetrated through the plastic plate 13, and the plural testing probes 14 are perpendicular to a bottom surface of the plastic plate 13. Consequently, as the plural testing probes 14 are moved toward the holder 12, the plural testing probes 14 are contacted with the circuit board 10 on the holder 12.

For testing the circuit board 10 which is placed on the holder 12, the plastic plate 13 is firstly moved downwardly by the user, and then the plural testing probes 14 are contacted with corresponding electrical contacts (not shown) of the circuit board 10. Then, after electricity is provided to the circuit board 10, the electrical properties (e.g. the resistance values, the capacitance values or the inductance values) of the plural electrical contacts of the circuit board 10 are measured. After the measured values of these electrical properties are obtained, the user may judge whether these electrical contacts are normal or abnormal by comparing the measured values of these electrical properties with preset electrical values. According to the comparing results, the user may determine whether the circuit board 10 passes the test or not. However, since the plural testing probes 14 are contacted with the corresponding electrical contacts during the process of testing the circuit board 10, the movement of negative ions may result in an electrostatic discharge effect. Due to the electrostatic discharge effect, the possibility of causing damage of the circuit board 10 increases.

Therefore, there is a need of providing a testing device for testing an under-test object while avoiding the generation of the electrostatic discharge effect.

SUMMARY OF THE INVENTION

An object of the present invention provides a testing device for testing an under-test object while avoiding the generation of the electrostatic discharge effect.

In accordance with an aspect of the present invention, there is provided a testing device for testing an under-test object. An electrical contact is formed on the under-test object. The testing device includes a base body, a holder, an electrically conductive plate, a testing probe and an insulation structure. The holder is disposed on the base body. The under-test object is supported by the holder. The electrically conductive plate is disposed on the base body and located over the holder. The electrically conductive plate is movable relative to the base body so as to be close to or far away from the holder. The testing probe is penetrated through the electrically conductive plate and protruded from a bottom surface of the electrically conductive plate. When the electrically conductive plate is close to the holder, the testing probe is contacted with the electrical contact. The insulation structure is disposed on the testing probe or the electrically conductive plate. The testing probe and the electrically conductive plate are separated from each other by the insulation structure.

From the above descriptions, the present invention provides the testing device. The testing device of the present invention uses the electrically conductive plate to replace the plastic plate of the conventional testing device. Consequently, the electrostatic discharge effect is avoided. Moreover, the insulation structure is arranged between the testing probe and the electrically conductive plate to separate the testing probe from the electrically conductive plate. Consequently, the current of the under-test object is not transmitted to the electrically conductive plate through the testing probe. In other words, the testing device of the present invention is capable of avoiding the electrostatic discharge effect and solving the electric leakage problem without causing damage of the under-test object and reducing the measurement accuracy.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
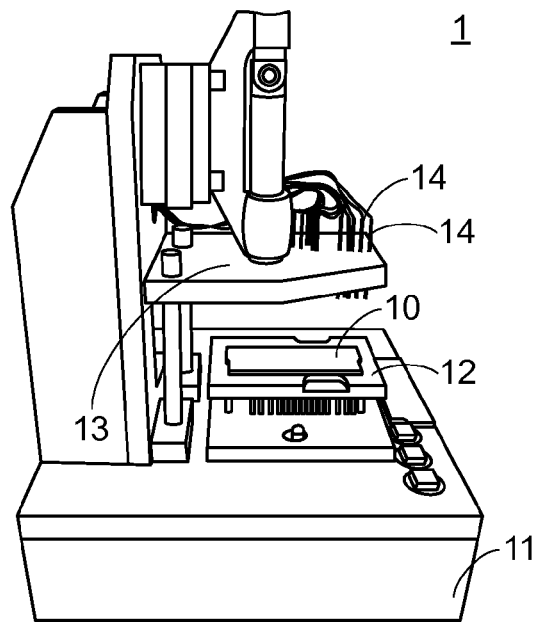
FIG. 1 schematically illustrates the structure of a conventional testing device.
Figure 2:
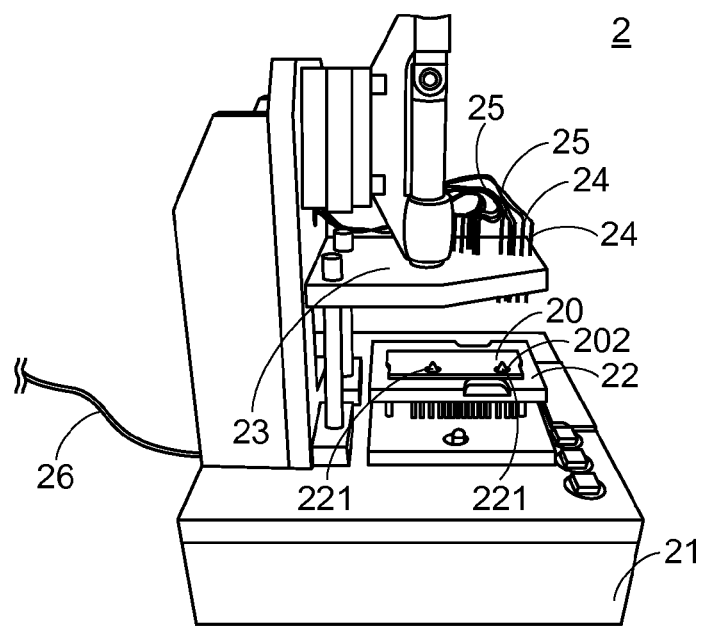
FIG. 2 is a schematic perspective view illustrating the structure of a detecting device according to a first embodiment of the present invention.
Figure 3:
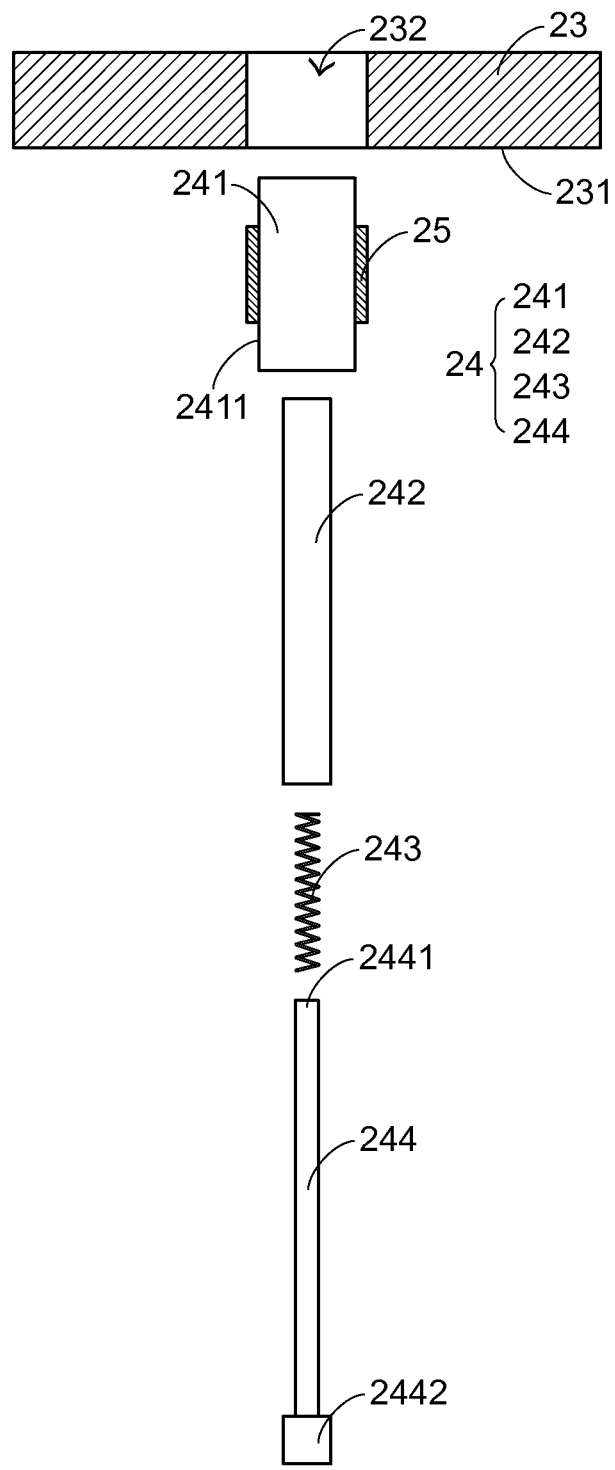
FIG. 3 is a schematic partial exploded view illustrating the relationship between an electrically conductive plate and a testing probe of the testing device according to the first embodiment of the present invention.

For eliminating the drawbacks of the conventional technologies, the present invention provides a testing device. Hereinafter, the structure of a detecting device of the present invention will be illustrated with reference to FIGS. 2 and 3. FIG. 2 is a schematic perspective view illustrating the structure of a detecting device according to a first embodiment of the present invention. FIG. 3 is a schematic partial exploded view illustrating the relationship between an electrically conductive plate and a testing probe of the testing device according to the first embodiment of the present invention. The testing device 2 comprises a base body 21, a holder 22, an electrically conductive plate 23, plural testing probes 24, plural insulation structures 25 (see FIG. 4) corresponding to the plural testing probes 24, and a transmission wire 26. The holder 22 is disposed on the base body 21 for supporting an under-test object 20. The electrically conductive plate 23 is disposed on the base body 21, and located over the holder 22. Moreover, in response to the user's operation, the electrically conductive plate 23 is movable relative to the base body 21 so as to be close to or far away from the holder 22. The plural testing probes 24 are penetrated through the electrically conductive plate 23, and the plural testing probes 24 are protruded from a bottom surface of the electrically conductive plate 23. Consequently, as the plural testing probes 24 are moved toward the holder 22, the plural testing probes 24 can be contacted with the under-test object 20 on the holder 22. By the plural insulation structures 25, the plural testing probes 24 are separated from the electrically conductive plate 23. Through the transmission wire 26, the communication between the testing device 2 and a computer system (not shown) is established. Consequently, the measured data of the under-test object 20 can be transmitted to the computer system through the transmission wire 26. In this embodiment, the electrically conductive plate 23 is made of a metallic material, and the under-test object 20 is a circuit board with plural electrical contacts 201 (see FIG. 5).

The concepts of the testing device 2 of the present invention will be illustrated as follows. As previously described, the conventional testing device 1 may generate an electrostatic discharge effect. In the testing device 2 of the present invention, the electrically conductive plate 23 made of a metallic material is employed. Since the electrically conductive plate 23 has the ability of conducting electrical charges, the movement of the negative ions can be guided by the electrically conductive plate 23. Under this circumstance, the problem of causing damage of the under-test object 20 by the electrostatic discharge effect will be avoided. However, although the electrically conductive plate 23 has the ability of conducting charges, a problem of causing electric leakage of the under-test object 20 may occur. The electric leakage of the under-test object 20 may reduce the measurement accuracy. For increasing the measurement accuracy, the plural insulation structures 25 of the testing device 2 are employed to inhibit the electric leakage.

Figure 4:
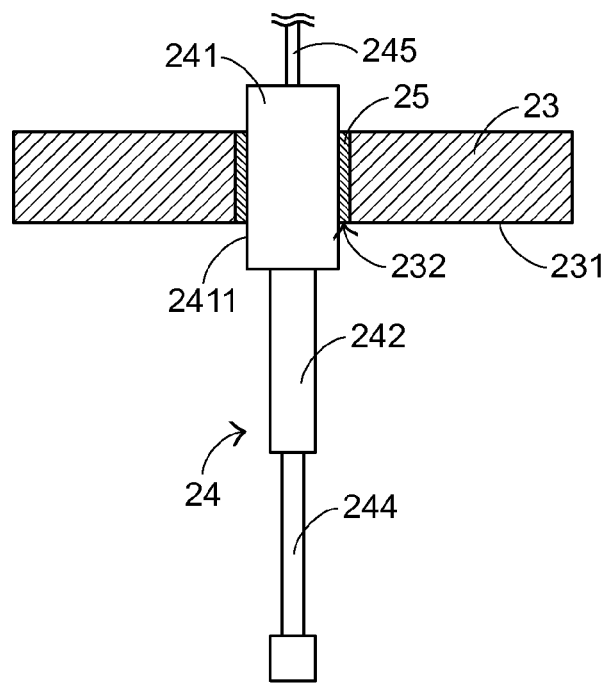
FIG. 4 is a schematic cross-sectional view illustrating a portion of the testing device according to the first embodiment of the present invention.

FIG. 4 is a schematic cross-sectional view illustrating a portion of the testing device according to the first embodiment of the present invention. Please refer to FIGS. 2~4. The electrically conductive plate 23 has plural openings 232 corresponding to the plural testing probes 24. For clarification and brevity, only one testing probe 24 and the corresponding opening 232 are shown in FIG. 3. The testing probe 24 comprises an outer tube 241, an inner tube 242, an elastic element 243, a plunger shaft 244 and a connecting wire 245. The inner tube 242 is partially accommodated within the outer tube 241. The elastic element 243 is accommodated within the inner tube 242 for providing an elastic force. The plunger shaft 244 is partially accommodated within the inner tube 242. A first end 2441 of the plunger shaft 244 is contacted with the elastic element 243. Moreover, when the electrically conductive plate 23 is close to the holder 22, a second end 2442 of the plunger shaft 244 is contacted with the corresponding electrical contact 201 of the under-test object 20. The corresponding insulation structure 25 is disposed on an outer surface 2411 of the outer tube 241. The connecting wire 245 is disposed on the outer tube 241 and electrically connected with the transmission wire 26. In this embodiment, the insulation structure 25 is an insulation ink layer, which is formed on the outer surface 2411 of the outer tube 241 by a coating process or a printing process. Due to the insulation structure 25, the outer tube 241 is not in direct contacted with the inner surface of the opening 232 of the electrically conductive plate 23, but the outer tube 241 is penetrated through the opening 232. As shown in FIG. 4, the testing probe 24 is penetrated through the opening 232 of the electrically conductive plate 23, and the outer tube 241 and the inner surface of the opening 232 are separated from each other by the insulation structure 25.

Figure 5:
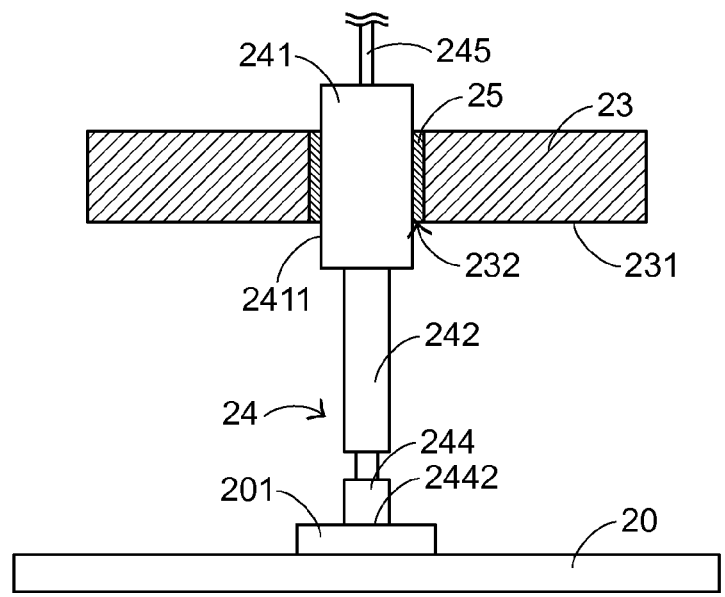
FIG. 5 is a schematic cross-sectional view illustrating a portion of the testing device according to the first embodiment of the present invention, in which the testing device is contacted with the under-test object.

Hereinafter, the use of the testing device 2 of the present invention to test the under-test object 20 will be illustrated with reference to FIGS. 2~5. FIG. 5 is a schematic cross-sectional view illustrating a portion of the testing device according to the first embodiment of the present invention, in which the testing device is contacted with the under-test object. For testing the under-test object 20 is firstly placed on the holder 22. Then, plural fixing posts 221 of the holder 22 are penetrated through corresponding fixing holes 202 of the under-test object 20, so that the under-test object 20 is fixed on the holder 22. Then, in response to the user's operation, the electrically conductive plate 23 is moved downwardly. Consequently, the second ends 2442 of the plunger shafts 244 are contacted with the corresponding electrical contacts 201 of the under-test object 20. Since the under-test object 20 is fixed and immobile at this moment, a pushing force is applied to the plunger shaft 244 by the corresponding electrical contact 201. In response to the pushing force by the electrical contact 201, the plunger shaft 244 is moved relative to the inner tube 242. At the same time, the elastic element 243 is pushed by first end 2441 of the plunger shaft 244. Consequently, the elastic element 243 is compressed to accumulate an elastic force.

After the under-test object 20 is fixed on the holder 20, the user may provide electricity to electrically conduct the under-test object 20. Consequently, the electrical properties (e.g. the resistance values, the capacitance values or the inductance values) of the corresponding electrical contacts 201 are measured by the plural testing probes 24. Then, the measured values of these electrical properties are transmitted to a computer system (not shown) through the connecting wire 245 and the transmission wire 26. On the other hand, a testing program is installed in the computer system. The testing program stores preset electrical values. After the measured values of these electrical properties are received, the testing program may judge whether the under-test object 20 passes the test by comparing the measured values of these electrical properties with the preset electrical values. For example, if the measured values of these electrical properties are equal to or close to the preset electrical values, the testing program judges that the electrical contacts are normal and determines that the under-test object 20 passes the test. Whereas, if the measured values of these electrical properties are largely different from the preset electrical values, the testing program judges that the electrical contacts are abnormal and determines that the under-test object 20 does not pass the test.

After the above testing procedure of the under-test object 20 is completed, the electrically conductive plate 23 is moved away from the holder 22 in response to the user's operation. Consequently, the under-test object 20 can be removed from the holder 22. Meanwhile, the testing probes 24 are no longer pushed by the electrical contacts 201. In addition, the elastic force of the elastic element 243 is released. Consequently, the testing probe 24 is returned to the original position where the testing probe 24 is not pushed. Then, a next under-test object may be placed on the holder 22, and the testing procedure of the next under-test object will be done.

The following two aspects should be especially described. Firstly, when the plural testing probes 24 are contacted with the corresponding electrical contact 201, the current generated by the electrically conducted under-test object 20 is transmitted to the plunger shaft 244, the inner tube 242 and the outer tube 241 through the electrical contact 201. In addition, the insulation structure 25 on the outer tube 241 may block the current so as to avoid the electric leakage. Consequently, the testing result of the testing device 2 is not adversely affected by the electrostatic discharge effect, and the electric leakage problem is avoided.

Figure 6:
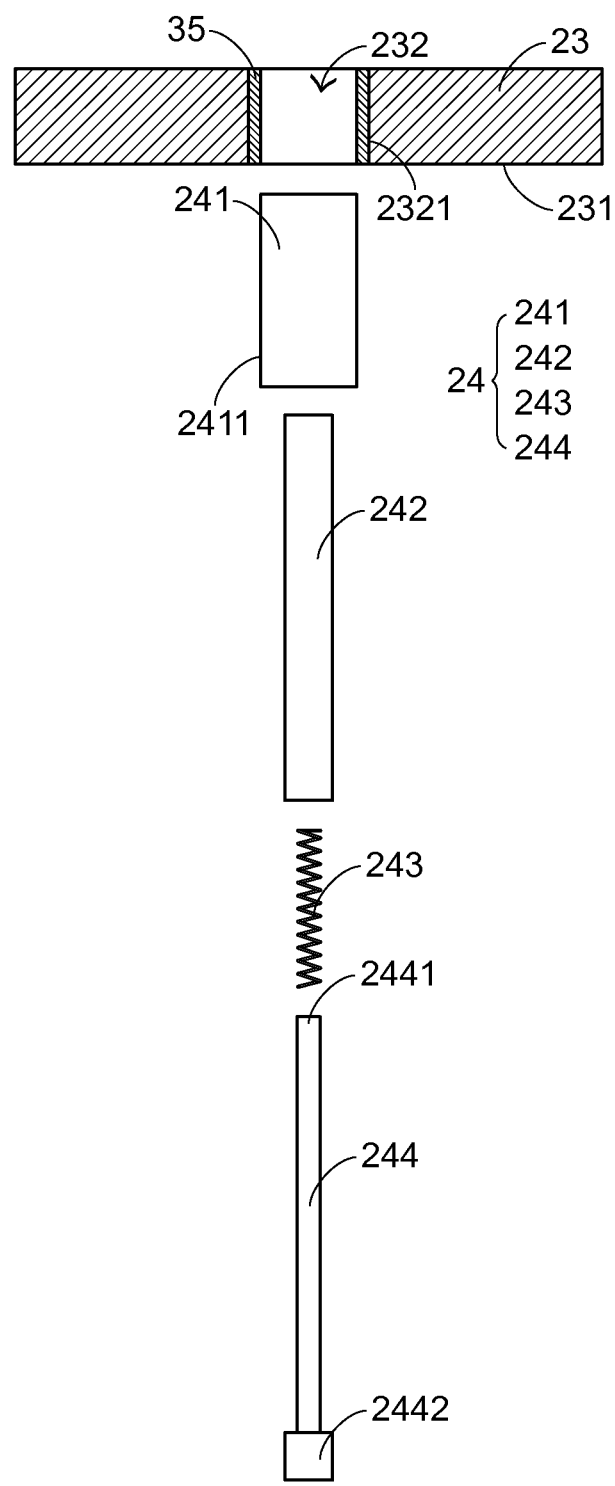
FIG. 6 is a schematic partial exploded view illustrating the relationship between an electrically conductive plate and a testing probe of the testing device according to a second embodiment of the present invention.

Secondly, in the above embodiment, the insulation structure 25 is disposed on the outer surface 2411 of the outer tube 241. It is noted that numerous modifications and alterations may be made while retaining the teachings of the invention. In another embodiment as shown in FIG. 6, the insulation structure 35 is disposed on an inner surface 2321 of the opening 232. When the testing probe 24 is penetrated through the opening 232 of the electrically conductive plate 23, the testing probe 24 and the electrically conductive plate 23 are separated from each other by the insulation structure 35. Consequently, the electric leakage problem is avoided.

From the above descriptions, the present invention provides the testing device. The testing device of the present invention uses the electrically conductive plate to replace the plastic plate of the conventional testing device. Consequently, the electrostatic discharge effect is avoided. Moreover, the insulation structure is arranged between the testing probe and the electrically conductive plate to separate the testing probe from the electrically conductive plate. Consequently, the current of the under-test object is not transmitted to the electrically conductive plate through the testing probe. In other words, the testing device of the present invention is capable of avoiding the electrostatic discharge effect and solving the electric leakage problem without causing damage of the under-test object and reducing the measurement accuracy.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A testing device for testing an under-test object, an electrical contact being formed on the under-test object, the testing device comprising:
    a base body;
    a holder disposed on the base body, wherein the under-test object is supported by the holder;
    an electrically conductive plate disposed on the base body and located over the holder, wherein the electrically conductive plate is movable relative to the base body so as to be close to or far away from the holder, wherein the electrically conductive plate has an opening, wherein the opening runs through the electrically conductive plate;
    a testing probe penetrated through the electrically conductive plate and protruded from a bottom surface of the electrically conductive plate, wherein when the electrically conductive plate is close to the holder, the testing probe is contacted with the electrical contact, wherein the testing probe comprises an outer tube which runs the opening; and
    an insulation structure disposed on an outer surface of the outer tube of the testing probe or an inner surface of the opening of the electrically conductive plate, wherein the testing probe and the electrically conductive plate are separated from each other by the insulation structure.

2. The testing device according to claim 1, wherein the insulation structure is disposed on an outer surface of the testing probe, wherein the insulation structure separates the testing probe from the electrically conductive plate so as to avoid an electric leakage problem.

3. The testing device according to claim 2, wherein the insulation structure is an insulation ink layer, which is formed on the outer surface of the testing probe by a coating process or a printing process.

4. The testing device according to claim 2, wherein the testing probe further comprises:
    an inner tube partially accommodated within the outer tube;
    an elastic element accommodated within the inner tube, and providing an elastic force; and
    a plunger shaft partially accommodated within the inner tube, wherein a first end of the plunger shaft is contacted with the elastic element, and a second end of the plunger shaft is contacted with the electrical contact, wherein when the second end of the plunger shaft is contacted with the electrical contact, the plunger shaft is pushed by the electrical contact, so that the plunger shaft is moved relative to the inner tube.

5. The testing device according to claim 4, wherein when the second end of the plunger shaft is contacted with the electrical contact, a current is transmitted from the under-test object to the plunger shaft, the inner tube and the outer tube through the electrical contact, and the insulation structure on the outer tube blocks the current so as to avoid the electric leakage problem.

6. The testing device according to claim 1, wherein the insulation structure is an insulation ink layer, which is formed on an inner surface of the opening by a coating process or a printing process.

7. The testing device according to claim 1, wherein when the testing probe is contacted with the electrical contact, a current is transmitted from the under-test object to the testing probe through the electrical contact, and the insulation structure on the inner surface of the opening blocks the current so as to avoid an electric leakage problem.

8. The testing device according to claim 1, wherein the holder comprises plural fixing posts and the under-test object comprises plural fixing holes, wherein after the plural fixing posts are penetrated through the corresponding fixing holes, the under-test object is fixed on the holder.

9. The testing device according to claim 1, wherein the electrically conductive plate is made of a metallic material.

* * * * *